United States Patent [19]

Sell, Jr.

[11] 3,804,676

[45] Apr. 16, 1974

[54] THERMOELECTRIC GENERATOR WITH THERMAL EXPANSION BLOCK

[75] Inventor: William Henry Sell, Jr., Kingsville, Md.

[73] Assignee: Isotopes, Inc., Westwood, N.J.

[22] Filed: Feb. 14, 1973

[21] Appl. No.: 332,333

Related U.S. Application Data

[62] Division of Ser. No. 185,511, Oct. 1, 1971, Pat. No. 3,744,560.

[52] U.S. Cl. .................. 136/205, 136/212, 136/242

[51] Int. Cl. .............................................. H01v 1/04

[58] Field of Search ........... 136/205, 211, 202, 212, 136/242

[56] References Cited

UNITED STATES PATENTS

| | | | |
|---|---|---|---|
| 3,325,312 | 6/1967 | Sonntag | 136/212 |
| 3,607,444 | 9/1971 | DeBucs | 136/212 X |
| 3,722,579 | 3/1973 | Hitchcock et al. | 136/202 X |

*Primary Examiner*—Carl D. Quarforth
*Assistant Examiner*—E. A. Miller
*Attorney, Agent, or Firm*—Fleit, Gipple & Jacobson

[57] ABSTRACT

A heat transferring device adapted for use in a thermoelectric generator which automatically compensates for shock, vibration, and thermal expansion is disclosed. The device consists of a relatively solid block composed of four slideably moveable wedges arranged in opposing pairs so that the movement of one pair of wedges together causes the other pair of wedges to move apart, one pair of opposing wedges being provided with means biasing them together.

1 Claim, 3 Drawing Figures

THERMOELECTRIC GENERATOR WITH THERMAL EXPANSION BLOCK

This is a division of application Ser. No. 185,511, filed Oct. 1, 1971, now U.S. Pat. No. 3,744,560.

BACKGROUND OF THE INVENTION

This invention relates to thermoelectric generators and to means for decreasing the temperature drop between the thermoelectric elements contained therein and the ambient.

It is well-known that a voltage potential can be produced across a material experiencing a temperature gradient. If two dissimilar materials are combined in a closed loop, and a temperature gradient is maintained between the junctions of the two materials, an electrical circuit can be created. A classic example of this is the thermocouple in which two dissimilar metal wires are joined at one end and connected to a potentiometer at the other end to form a circuit. If a temperature drop is maintained between the end junctions, a voltage is set up, and an electric current flows through the circuit. When the potentiometer is balanced for zero current, the voltage potential corresponding to the temperature gradient between the end junctions is measured.

More recently, this phenomenon has found application in the field of thermoelectric generators. A thermoelectric generator is a device in which thermal energy is converted into electrical power. The heart of such a generator is the thermoelectric module, which is composed of a number of thermoelectric elements, each element capable of producing a small quantity of power. In operation, a temperature differential is maintained across these elements, thereby producing a voltage potential in each element. While the temperature drop across the thermoelectric elements in a typical generator is relatively high, usually on the order of 300° to 600° F., the voltage potential produced by a single thermoelectric element is relatively small. Thus, in order to build a thermoelectric module capable of producing a larger voltage potential, the thermoelectric elements are usually connected in series electrically so that the voltage potential from the individual elements are added together. When an electrical load is applied to this series circuit, an appreciable electric current is produced at a voltage proportional to the number of elements in the series circuit. The result is a relatively large output power equal to the product of the resultant total voltage potential and the current.

The thermoelectric elements used in such a thermoelectric generator are usually shaped in the form of blocks or cylinders and are made from alloys of materials which, when subjected to a temperature drop across their lengths produce a noticeable voltage potential. Moreover, it has been found that some alloys, when subjected to a temperature differential, cause an electric current to flow from hot to cold, while other alloys cause an electric current to flow from cold to hot. Alloys that produce an electric current flowing from hot to cold are referred to as positive, while alloys that produce an electric current flowing from cold to hot are referred to as negative.

The alloys used to make elements for thermoelectric generators are well-known in the art. Examples include chromel/alumel, iron/constantan, PbTe, SiGe, SnTe, PbSnTe, PbSnMnTe, BiTe, GeBiTe, BiSbTe, and BiSeTe. The elements involved in each alloy are normally mixed in stoichiometric or near stoichiometric proportions. Small additions of certain foreign compounds which have specific cationic or anionic species are used to adjust the charge carrier concentration in the alloy and thus create the positive or negative thermoelectric material. Materials which produce this effect are commonly referred to as dopants.

In a particularly successful thermoelectric module positive and negative thermoelectric elements are paired together to form thermoelectric couples. Each couple is fabricated from one positive element, one negative element, and a hot shoe which electrically connects the hot ends of both elements. This configuration allows the current to flow from the cold side to the hot side through the negative element, across the hot shoe, and then from the hot side to the cold side through the positive element. This allows simple cold end circuitry to electrically connect the couples in series with positive and negative elements alternating in line.

For example, an electrical lead is connected to the cold end of the first positive element; the hot end of the first positive element is connected to the hot end of a first negative element; the cold end of the first negative element is connected to the cold end of a second positive element; the hot end of the second positive element is connected to the hot end of a second negative element; and so forth until the series of elements is completed and a lead is provided on the cold end of the last negative element. In this way, with a minimum amount of associated circuitry, the voltage potential produced in each individual thermoelectric element is added to the voltage potential produced in all the other elements thus producing a relatively large voltage drop for the circuit.

In the construction of a typical thermoelectric generator, a heat source is used to provide a high temperature in one area of the generator. Next to the heat source is located the thermoelectric module comprised of a number of thermoelectric elements, each positioned thermally in parallel. That is, each of the thermoelectric elements has one end positioned in a heat-conducting relationship with the heat source. The other ends of the thermoelectric elements, that is the ends located opposite the heat source are placed in heat-conducting relationship with an exterior wall of the generator, hereinafter referred to as the "ambient surface," where heat can be radiated or convected directly to the surrounding atmosphere.

In some situations the exterior side of the ambient surface can be specially constructed in order to expedite the flow of heat away from the ambient surface. For example, the exterior side of the ambient surface can be provided with a system of metal fins designed to radiate or convect heat to the environment. In other situations, for example, when the generator is used under water, the ambient surface as is may be sufficient to provide adequate heat flow away from the generator.

In operation, the typical thermoelectric generator is usually subjected to vibrations and shock due to internal and external causes. Moreover, because of high temperatures on the hot side of the thermoelectric elements, changes in ambient conditions, changes in operational parameters, and material differences, the parts of the generator may undergo relative thermal expansion and contraction.

In order to alleviate these problems, some thermoelectric generators have been provided with special shock and vibration absorbing devices. Typically, these devices take the form of a system of helical springs and pistons, which are placed between the cold ends of the thermoelectric elements and the ambient surface, so that the piston heads abut against the cold ends of the thermoelectric elements.

These devices have proved to be less than satisfactory in operation, because they provide a substantial barrier to heat flow. Since the voltage potential, and hence the power output of the thermoelectric generator, is a function of the temperature drop across the thermoelectric elements, it is preferable to cool the cold ends of the thermoelectric elements as much as possible. Since each piston and spring assembly has a relatively large amount of open space to accommodate the spring and allow for piston travel, they are unable to cool the cold ends of the thermoelectric elements in an efficient manner.

It is an object of this invention to provide a device which can alleviate the problems of shock, vibration and thermal expansion and contraction inherent in the operation of a thermoelectric generator and at the same time conduct heat in an improved manner.

It is a further object of the invention to provide a device which is capable of maintaining the cold ends of the thermoelectric elements in a thermoelectric generator at a lower temperature than the piston and spring devices presently used in thermoelectric generators.

BRIEF SUMMARY OF THE INVENTION

These and other objects are accomplished by this invention, whereby a relatively solid metallic thermal block having high heat conductance and an automatically variable size is provided. In particular, the inventive thermal block consists of four spring loaded solid wedges of a heat-conducting material arranged in opposing pairs to form a relatively solid block capable of not only efficiently transferring heat but also of adjusting its size in the direction of heat flow to accomodate changes in size of the surrounding medium. One pair of the opposing wedges are biased towards each other which in turn biases the alternate wedges apart. The alternate wedges are thus able to clamp the block firmly in place between the cold ends of the thermoelectric elements and the ambient surface of a thermoelectric generator to automatically absorb shock and vibrations and to automatically adjust to changes in size of the generator parts including the block itself due to thermal expansion or contraction.

BRIEF DESCRIPTION OF THE DRAWINGS

The nature of the invention can be better understood by reference to the following drawings wherein.

DETAILED DESCRIPTION

Figure 1:
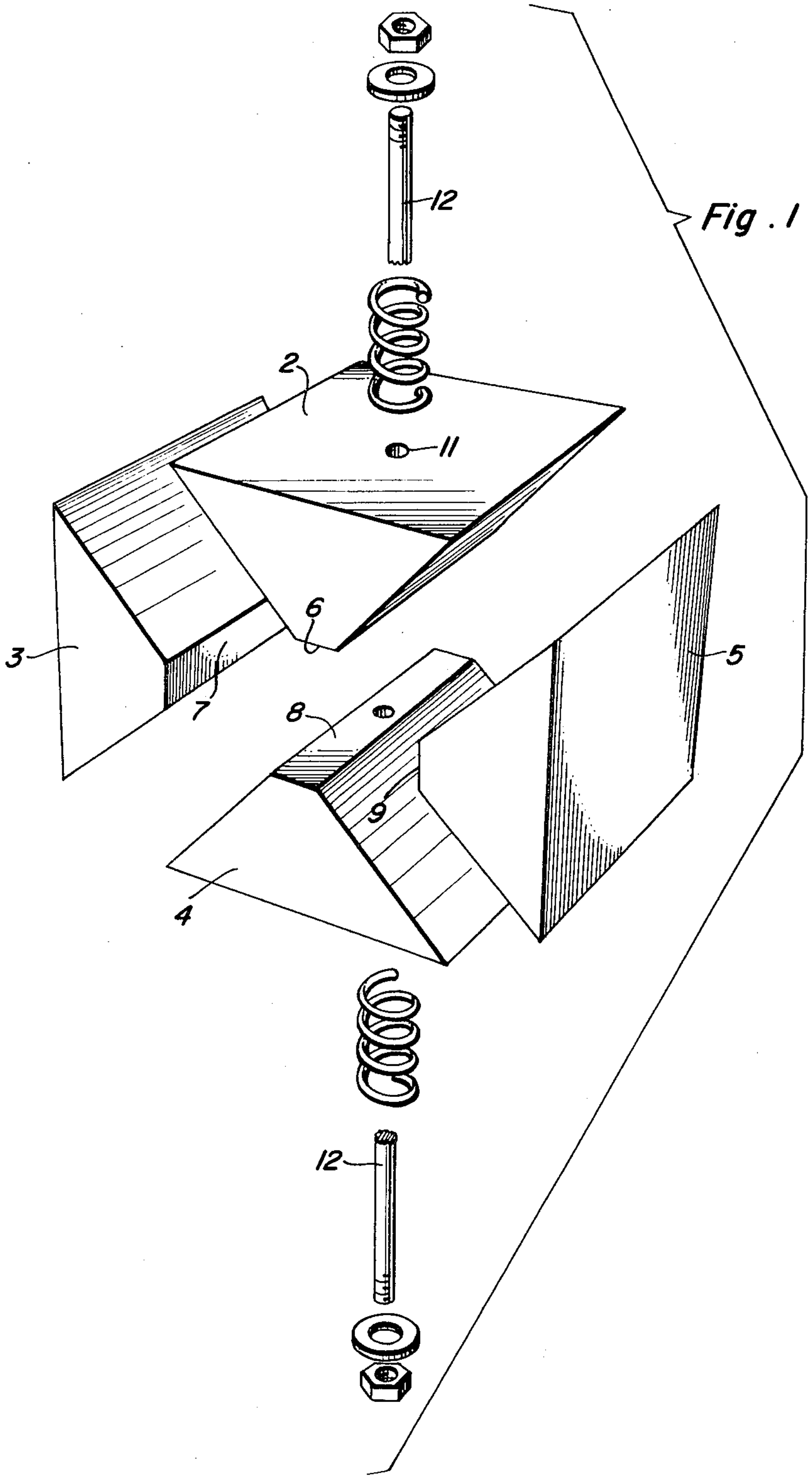
FIG. 1 is a diagrammatic view of the thermal block of this invention showing the shape of the individual wedges and the manner in which they are positioned.

As can be seen from FIG. 1, the thermal block of this invention consists of four individual wedges 2, 3, 4 and 5 having generally trapezoidal cross-sections. The wedges are arranged so that the shorter bases of each wedge 6, 7, 8 and 9, respectively, face towards the center of the thermal block.

Figure 2:
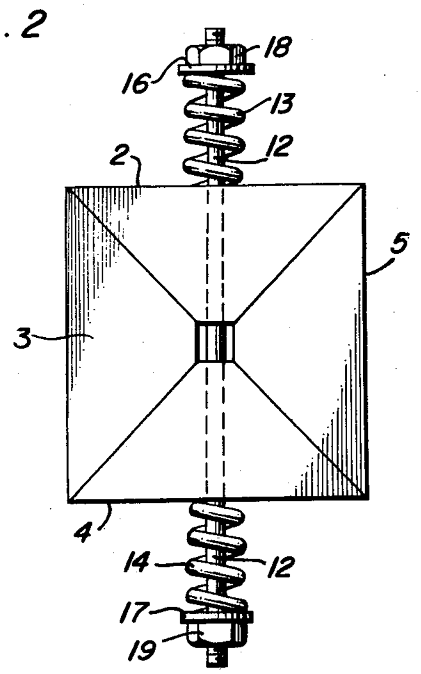
FIG. 2 is an end view of an assembled thermal block.

As can be seen from FIG. 2, the individual wedges are made so that when they are placed together, the sides of adjacent wedges mate with each other. This enables adjacent wedges to slideably move with respect to each other, which in turn causes pairs of opposing wedges to move oppositely of each other.

Although the thermal block will efficiently transfer energy when the adjacent side faces are in intimate contact with each other, it is preferable to interpose a layer of thermal grease between adjoining wedges. In this preferred embodiment, the thermal grease not only lubricates the adjacent wedges allowing them to slide more easily but also improves the heat transfer properties of the interfaces between adjacent wedges.

The thermal greases used according to this invention are well-known in the art. Examples of these thermal greases include Dow Corning's silicone heat sink compound 340, and California Research Corporation's aluminum grease GOR-5860A. The efficiency of the thermal block as a heat conducting device will be dependent on the properties of the thermal grease employed as well as the condition of mating surfaces. The mating surfaces do not have to be highly polished but a reasonable finish is desired to reduce friction and improve heat transfer capabilities.

As shown in the drawings, a pair of opposing wedges, wedges 2 and 4, are provided with a hole 11 through which a bolt 12 is positioned. Springs 13 and 14 are placed on either ends of bolt 12 and forced into compression against wedges 2 and 4 by washers 16 and 17 and nuts 18 and 19.

For use in a thermoelectric generator, the thermal block is placed between the cold ends of the thermoelectric elements and the ambient surface so that the longer bases of wedges 3 and 5 contact the thermoelectric elements and the ambient surface of the generator. As can be seen in FIG. 2, the force of springs 13 and 14 biases wedges 2 and 4 together which in turn biases wedge members 3 and 5 apart. This biasing causes wedges 3 and 5 to securely abut the adjacent thermoelectric elements and ambient surface, which in turn allows the block to be firmly held in place. Moreover, the pressure of wedges 3 and 5 against the thermoelectric elements and the ambient surface improves the heat transfer properties of the entire block, since the interfaces between the block and the adjacent surfaces are as compact as possible. In addition, because a spring force is used, the position of the wedges with respect to each other automatically adjusts in response to shock and vibrations as well as thermal expansion and contraction of the wedges and other parts of the generator.

The wedges of the block of this invention can be made from any material which is a good heat conductor. Such materials are well known in the art and are exemplified in the following table:

Table I

HIGH HEAT CONDUCTION MATERIALS

| Material | Approximate Thermal Conductivity Btu/hr ft °F. |
|---|---|
| Silver, Ag | 235 |
| Copper, Cu | 223 |
| Aluminum, Al | 118 |
| Magnesium, Mg | 99 |
| Tungsten, W | 94 |
| Brass, (70% Cu, 30% Zn) | 64 |
| Molybdenum, Mo | 71 |
| Zinc, Zn | 65 |
| Nickel, Ni | 52 |

By appropriate selection of the heat conducting material and interface grease, the thermal block can be constructed to have practically any desired heat conducting characteristics.

The individual wedges of the thermal block of this invention, although shown in the drawing as having trapezoidal cross-sections, are not limited to this type of cross-section. On the contrary, they may have any type of cross-section which allows one pair of opposing wedges to move together when the other pair moves apart and vice versa and which further does not obstruct the biasing means. For example, one pair of wedges may be triangular in cross-section, while the other pair is trapezoidal in cross-section.

In addition, it is not necessary that the wedges in an opposing pair have congruent cross-sections. For example, one wedge may have a trapezoidal cross-section having highly acute longer base-side angles while the opposing wedge may have a trapezoidal cross-section whose longer base-side angles approach 90° angles. Moreover, it is not necessary that the cross-sections of the individual wedges be isosceles triangles or trapezoids.

It should be noted that a unique feature of this invention is that the clamping force exerted by the thermal block as well as the relative movement between opposing wedges can be adjusted across a very broad range. Specifically, not only can these parameters be controlled by appropriate selection of the biasing means but they may also be controlled by appropriate selection of the shape of the individual wedges. For example, neglecting friction which should be minimal when thermal grease is utilized, the clamping force exerted by opposing wedges 3 and 5 of the thermal block of FIG. 2 is approximately the same as the force exerted by springs 13 and 14, since the longer base and sides of each wedge define an angle of approximately 45°. The relative motion of opposing wedges for this arrangement is also in a 1:1 ratio. However, if the angles between the longer bases and the sides of wedges 2 and 4 are increased to 60°, the clamping force exerted by opposing wedges 3 and 5 is approximately twice as great as the force provided by springs 13 and 14. As a consequence, the relative movement between input wedges 2 and 4, the clamping wedges 3 and 5, is in a ratio of approximately 2:1. Thus as can be seen, the clamping force provided by this thermal block can be adjusted to within wide limits with a trade-off of relative movement.

In addition to the above, the wedges need not be shaped so that the thermal block must be placed between two substantially parallel surfaces. On the contrary, the individual wedges can be designed so that the thermal block can be placed between surfaces positioned at various angles from each other. Moreover, the wedges need not be placed against flat surfaces only but may be fashioned to fit flush against any shaped surface.

While the biasing means used to bias one pair of opposing wedges together has been shown in the drawings to be a spring and bolt mechanism, the biasing means may be any system which forces one pair of opposing wedges together. For example, the biasing means may comprise a tension spring positioned within the hole located in the one pair of opposing wedges. Alternatively, the biasing force may be provided by forming an opposing pair of wedges from a pair of attracting magnets.

Although the invention has been specifically described above, a better understanding of the invention may be had by reference to the following example.

EXAMPLE

Figure 3:
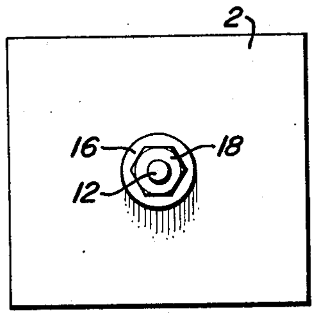
FIG. 3 is a top view of an assembled thermal block.

A thermal block was built in the shape of the block shown in FIGS. 2 and 3. The individual wedges were composed of aluminum and had a trapezoidal cross-section with the sides and bases of each trapezoid forming 45° angles. The longer base of each trapezoid measured 1.845 inches, while the shorter base measured 0.29 inches and the height of the trapezoid was 0.7775 inches. Each wedge was 2.150 inches long. A 0.177 inch diameter hole was drilled through the center of two of the wedges in order to receive a bolt. Dow Corning 340 silicone heat sink compound was then applied to the side faces of the trapezoids. The wedges were arranged as shown in FIG. 2 with the pair of wedges having holes positioned opposite each other. A bolt was placed through the holes, and two springs were placed over the ends of the bolts followed by washers and nuts as shown in the drawings.

Two thermal blocks thus formed were placed in the cold end of a conventional thermoelectric generator. The thermoelectric elements in the module of this thermoelectric generator were composed of alternating pairs of positive and negative elements shaped in the form of cubes. The positive elements were composed of BiSbTe and the negative elements were composed of BiTe. A total of 166 pairs of positive and negative elements were placed in the module. At the hot end of the thermoelectric generator, an electrical type heat source was used which produced a termperature of approximately 480° F. at the hot end of the thermoelectric elements. The ambient surface of this thermoelectric generator was provided with a water cooled heat sink to improve the flow of heat from the generator to the environment.

The thermal blocks made as described above were each placed so that one wedge of the pair of wedges not containing the spring-bolt biasing means abutted the cold ends of the thermoelectric elements while the other wedge of this pair abutted the ambient surface.

After arriving at a steady state, it was found that the temperature drop across the thermal block was about 50° F. for an approximate 280 watt heat flow.

While the thermal block of the invention has been described with particular reference to the cold end of a thermoelectric generator, it is clear that it can be used in any application requiring controlled heat flow across two surfaces of different temperature. For example, the thermal block of this invention could be used at the hot end of a thermoelectric generator. Alternatively, it could be used as a means of cooling high powered electronic equipment by connecting the source of heat generation to a suitable heat sink.

The foregoing description has been presented for illustrative purposes only and is not intended to limit the invention in any way. Thus, it should be understood that all modifications of the foregoing description which reasonably suggest themselves to persons skilled in the art are intended to be included in the present invention which is to be limited only by the following claims.

What is claimed is:

1. In a thermoelectric generator having a heat source, thermoelectric elements having hot and cold ends, an ambient surface and heat-conducting means between the cold ends of the thermoelectric elements and the ambient surface, the improvement comprising employing as said heat-conducting means a thermal block comprising four wedges, said wedges arranged in alternating pairs, the wedges in one alternating pair being biased towards each other, said wedges adapted so that adjacent wedges are slideably moveable on their adjacent surfaces, said pairs adapted so that movement of the wedges of one pair together causes a movement apart of the wedges of the other pair.

* * * * *